(12) United States Patent
Ueda et al.

(10) Patent No.: US 6,558,817 B1
(45) Date of Patent: May 6, 2003

(54) ORGANIC ELECTROLUMINESCENT ELEMENT

(75) Inventors: Hideaki Ueda, Kishiwada (JP); Takeshi Kitahora, Amagasaki (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/392,809

(22) Filed: Sep. 9, 1999

Related U.S. Application Data
(60) Provisional application No. 60/126,037, filed on Mar. 25, 1999.

(30) Foreign Application Priority Data

Sep. 9, 1998 (JP) .......................................... 10-255824

(51) Int. Cl.[7] .............................................. H05B 33/00
(52) U.S. Cl. ....................... 428/690; 428/917; 313/504; 313/505; 313/506
(58) Field of Search ............................. 428/690, 917; 313/504–506

(56) References Cited

U.S. PATENT DOCUMENTS

| | | | |
|---|---|---|---|
| 3,530,325 A | 9/1970 | Mehl et al. .................. 313/108 |
| 4,539,507 A | 9/1985 | VanSlyke et al. ........... 313/504 |
| 4,720,432 A | 1/1988 | VanSlyke et al. ........... 428/457 |
| 4,885,211 A | 12/1989 | Tang et al. .................. 428/457 |
| 5,429,884 A | 7/1995 | Namiki et al. .............. 428/690 |
| 5,925,472 A * | 7/1999 | Hu et al. ..................... 428/690 |

FOREIGN PATENT DOCUMENTS

| | | |
|---|---|---|
| JP | 63-295695 | 12/1988 |
| JP | 2-15595 | 1/1990 |
| JP | 3-37993 | 2/1991 |
| JP | 4-132191 | 5/1992 |
| JP | 5-121172 | 5/1993 |
| JP | 59-194393 | 11/1994 |
| JP | 10270171 | 10/1998 |
| JP | 11120894 | 4/1999 |
| WO | WO 98/37736 * | 8/1998 |

OTHER PUBLICATIONS

Hung, L. S. et al. "Enhanced electron injection in organic electroluminescence devices using an Al/LiF electrode," *Appl Phys Lett* (Jan. 13, 1997) 70(2):152–154.

* cited by examiner

*Primary Examiner*—Cynthia H. Kelly
*Assistant Examiner*—Dawn Garrett
(74) *Attorney, Agent, or Firm*—Morrison & Foerster LLP

(57) ABSTRACT

An organic electroluminescent element includes at least a positive electrode, an electron injection layer, and a negative electrode, wherein the electron injection layer is formed of an alkali metal organic salt, an alkaline earth metal organic salt, an alkali metal organometallic complex or an alkaline earth metal organometallic complex.

11 Claims, 2 Drawing Sheets

ORGANIC ELECTROLUMINESCENT ELEMENT

This appln claims benefit of Prov. No. 60/126,037 filed Mar. 25, 1999.

FIELD OF THE INVENTION

This invention relates to an organic electroluminescent element.

BACKGROUND OF THE INVENTION

An organic electroluminescent element is an element formed using organic compounds as a luminescent material which luminesces in conjunction with electrical signals.

An organic electroluminescent element comprises an organic luminescent layer disposed between a pair of opposing electrodes. Luminescence is the phenomenon occurring when electrons are injected from one electrode and holes are injected from the other electrode to excite the luminescent material in the luminescent layer to a high energy potential, which induces the surplus energy to be discharged as light when the excited luminescent material returns to its original state.

In addition to the aforesaid basic structure, a hole injection layer is added to the electrode which injects holes, and an electron transporting layer is added to the electrode which injects electrons so as to improve the luminescence efficiency.

An example of an organic electroluminescent element is disclosed in U.S. Pat. No. 3,530,325, which uses monocrystalline anthracene as a luminescent material.

Japanese Laid-Open Patent Application No. SHO 59-194393 discloses the combination of a hole injection layer and an organic luminescent layer.

Japanese Laid-Open Patent No. SHO 63-295695 discloses the combination of an organic hole injection/transporting layer and an organic electron injection/transporting layer.

These multilayered electroluminescent elements are structured as multiple layers of an organic luminescent material, and a charge transporting organic material (charge transporting member), and electrodes, which move electrons and holes injected by the respective electrodes through the charge transporting material, and luminesce when the holes and electrons re-combine. Examples of useful organic luminescent materials include organic luminescing colorants such as 8-quinolinol-aluminum complex, and coumarin compounds. Examples of useful charge transporting materials include N'-di(m-tolyl)N,N'-diphenylbenzidine, amino compounds such as 1,1-bis[N,N-di(p-tolyl)aminophenyl] cyclohexane, 4-(N,N-diphenyl)aminobenzaldehyde-N,N-diphenylhydrazone compounds, and the like. Porphyrin compounds such as copper phthalocyanine have also been proposed.

Organic electroluminescent elements have high luminescence characteristics, but have not attained practicality due to their insufficient stability while luminescing and storage stability. The stability of the charge transporting layer is indicated as one problem relating to stability of the element during luminescence and to the storage stability of the element. The layers formed by the organic material of the electroluminescent element are very thin, to the order of several tens to several hundred nanometers, and the voltage applied per unit thickness is extremely high. Exothermic heat is produced by luminescence and current flow, which requires electrical, thermal, and chemical stability of the charge transporting layer.

The use of materials other than aluminum for the negative electrode to reduce the luminescence starting voltage of the organic electroluminescent element has been disclosed in Japanese Laid-Open Patent Application Nos. HEI 2-15595, 3-37994, 4-132191, and 5-121172. The use of metal oxide materials as the electron injection layer has also been reported in Appl. Phys. Lett. 70 (2) 152–154.

The use of metals other than aluminum produces disadvantages such as difficult layer forming conditions and easy oxidation. Even when metal oxides are used, layer formation is difficult inasmuch as the layer must be made extremely thin. Accordingly, it is difficult to produce an organic electroluminescent element which has a high luminescence intensity and maintains stable performance with repeated use.

SUMMARY OF THE INVENTION

In view of the aforesaid background, a feature of the invention is to provide an organic electroluminescent element which has a high luminescence intensity and maintains performance stability with repeated use.

The present invention relates an organic electroluminescent element comprising at least a positive electrode, an electron injection layer, and a negative electrode, wherein the electron injection layer is formed of an alkali metal organic salt, an alkaline earth metal organic salt, an alkali metal organometallic complex or an alkaline earth metal organometallic complex.

A hole injection/transporting layer may be interposed between the positive electrode and the luminescent layer. An electron transporting layer may be interposed between the luminescent layer and the electron injecting layer. The electron injection layer may be formed as a mixed layer formed of a mixture of an alkali metal organic salt, an alkaline earth metal organic salt, an alkali metal organometallic complex and/or an alkaline earth metal organometallic complex.

DETAILED DESCRIPTION OF THE INVENTION

The organic electroluminescent element of the present invention provides at least a luminescent layer and an electron injection layer between electrodes, and the electron injection layer is formed of an alkali metal organic salt, an alkaline earth metal organic salt, an alkali metal organometallic complex or an alkaline earth metal organometallic complex. Preferred embodiments of the present invention are described hereinafter.

The preferred embodiments of the organic electroluminescent element of the present invention are shown in FIGS. 1 through 4.

Figure 1:
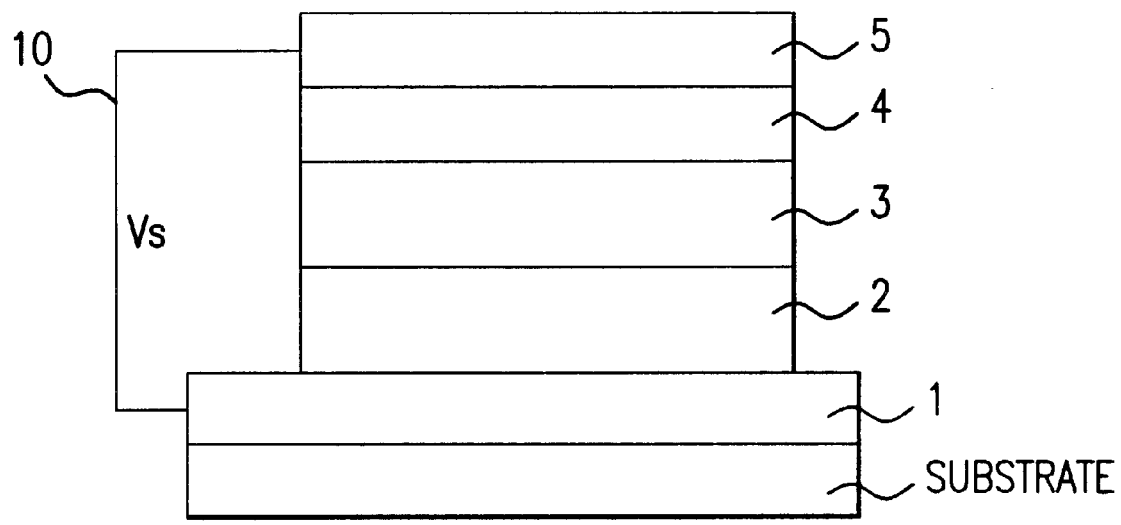
FIG. 1 is a cross section view showing schematically the construction of an organic electroluminescent element of an embodiment of this invention.

In FIG. 1, hole injection/transporting layer 2, organic luminescent layer 3, electron injection layer 4, and negative electrode 5 are sequentially superimposed over positive electrode 1, wherein the electron injection layer comprises an alkali metal organic salt, an alkaline earth metal organic salt, an alkali metal organometallic complex or an alkaline earth metal organometallic complex.

Figure 2:
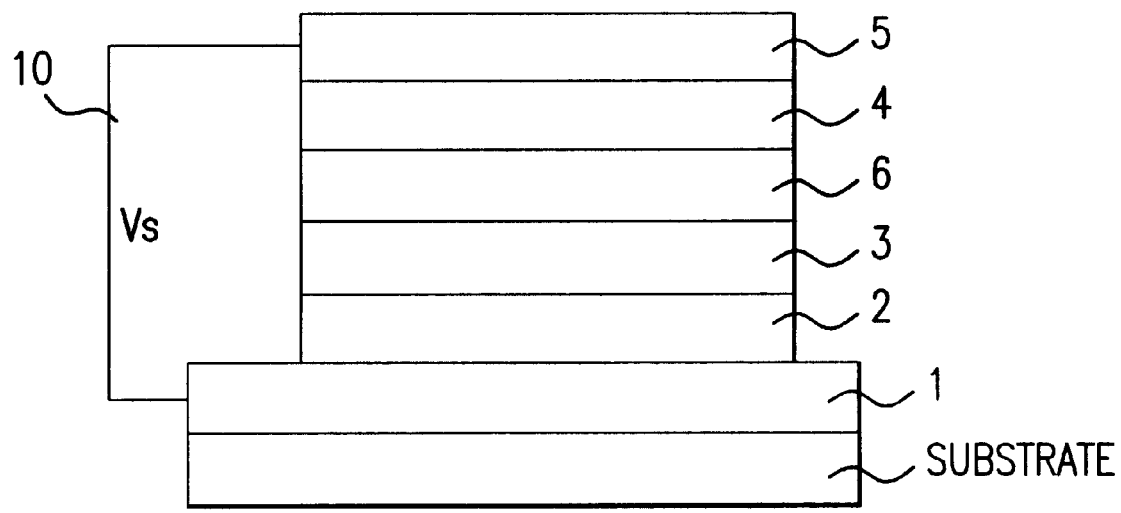
FIG. 2 is a cross section view showing schematically the construction of an organic electroluminescent element of another embodiment of this invention.

In FIG. 2, positive electrode 1 forms a substrate or layer over which are sequentially superimposed hole injection/transporting layer 2, organic luminescent layer 3, electron transporting layer 6, electron injection layer 4, and negative electrode 5, wherein the electron injection layer 4 comprises an alkali metal organic salt, an alkaline earth metal organic salt, an alkali metal organometallic complex or an alkaline earth metal organometallic complex.

Figure 3:
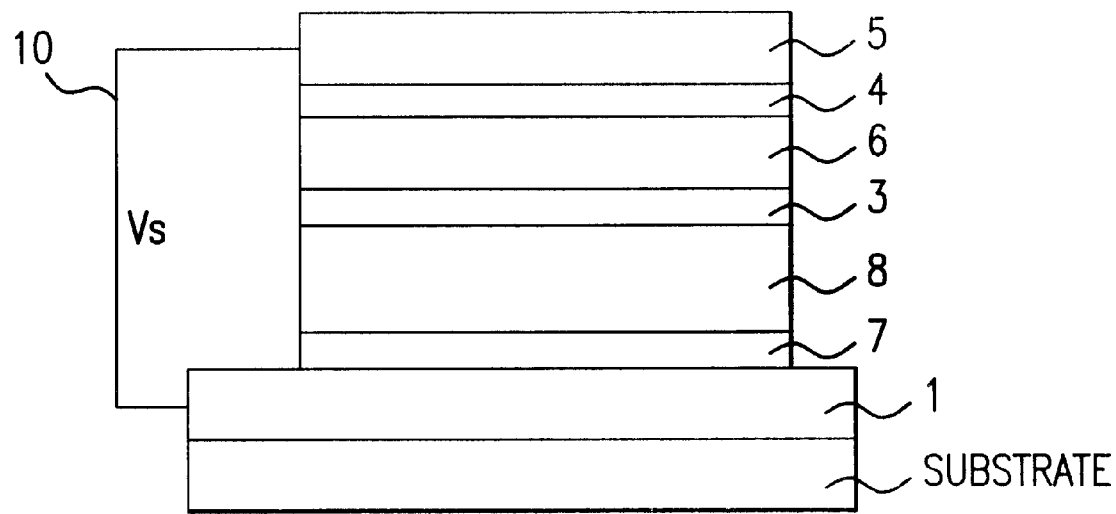
FIG. 3 is a cross section view showing schematically the construction of an organic electroluminescent element of yet another embodiment of this invention.

In FIG. 3, positive electrode 1 forms a substrate or layer over which are sequentially superimposed hole injection layer 7, hole transporting layer 8, organic luminescent layer 3, electron transporting layer 6, electron injection layer 4, and negative electrode 5, wherein the electron injection layer 4 comprises layer is formed of an alkali metal organic salt, an alkaline earth metal organic salt, an alkali metal organometallic complex or an alkaline earth metal organometallic complex.

Figure 4:
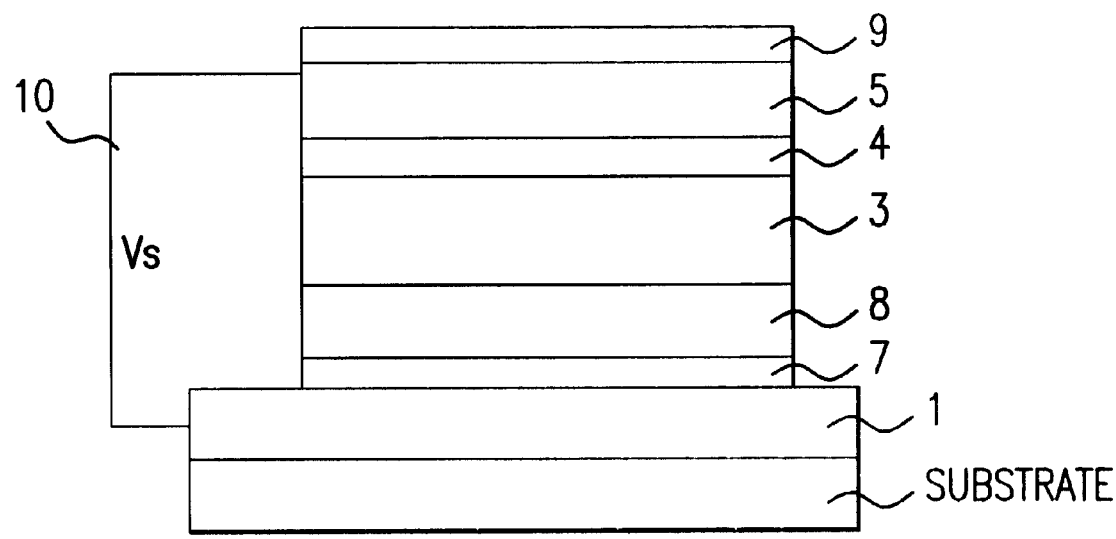
FIG. 4 is a cross section view showing schematically the construction of an organic electroluminescent element of a further embodiment of this invention.

In FIG. 4, positive electrode 1 is a substrate or layer over which are sequentially superimposed hole injection layer 7, hole transporting layer 8, organic luminescent layer 3, electron injection layer 4, and negative electrode 5, wherein the electron injection layer 4 comprises an alkali metal organic salt, an alkaline earth metal organic salt, an alkali metal organometallic complex or an alkaline earth metal organometallic complex.

In these embodiments, organic electroluminescent layer 3 is induced to luminesce by the application of a voltage across positive electrode 1 and negative electrode 5.

Electron injectability is improved by using an alkali metal organic salt, an alkaline earth metal organic salt, an alkali metal organometallic complex or an alkaline earth metal organometallic complex in the electron injection layer, and providing a thin layer 0.1 to 20 nm in thickness provides an extremely smooth electron flow by increasing the electric field intensity, thereby reducing the luminescence starting voltage required to induce luminescence in the organic electroluminescent element of the invention and further allowing stable luminescence over long periods due to the low voltage requirements of the element of this invention.

The conductive material used for the positive electrode in the organic electroluminescent element will have a work function greater than 4.5 eV; examples of useful materials include carbon, vanadium, iron, cobalt, nickel, copper, zinc, tungsten, silver, tin, gold, and alloys thereof, as well as conductive metal compounds such as tin oxide, indium oxide, antimony oxide, zinc oxide, zirconium oxide and the like.

The metal used to form the negative electrode will have a work function greater than 4.5 eV; examples of useful metals include aluminum, indium, magnesium, calcium, titanium, yttrium, lithium, gadolinium, ytterbium, ruthenium, manganese, and alloys thereof.

In the organic electroluminescent element, at least one electrode among the positive electrode and the negative electrode must be a transparent electrode so that the luminescence is visible. Since transparency is easily lost when the transparent electrode is the negative electrode, it is desirable that the positive electrode be used as the transparent electrode.

When the transparent electrode is formed, a conductive material such as previously described may be dispersed in a resin or sol-gel and applied onto a transparent substrate via vacuum deposition, sputtering or the like to assure a desired conductivity and light transmittance.

The transparent substrate is not particularly restricted insofar as it has suitable strength so as to not be adversely affected by heat produced during vacuum deposition when manufacturing the organic electroluminescent element. Examples of useful materials include glass substrates and transparent resins, e.g., polyethylene, polypropylene, polyether sulfone, polyether ketone and the like. A transparent electrode may be formed on a glass substrate using well known commercial products such as ITO, NESA and the like.

The construction of each layer and manufacturing method are described hereinafter regarding the example shown in FIG. 1.

First, a hole injecting/transporting layer 2 is formed on the positive electrode 1. The hole injecting/transporting layer 2 may be formed via vacuum deposition of a compound for forming such a hole injection/transporting later, or may be formed by dip coating or spin coating using a fluid comprising such a compound dissolved in a solvent or suitable resin.

When the hole injecting/transporting layer is formed by vacuum deposition, the thickness of the layer is normally 1 to 300 nm, and when formed by an application method, the layer thickness is normally 1 to 500 nm.

As the thickness of the layer increases, a greater voltage must be applied to induce luminescence, thereby adversely affecting luminescence efficiency, and causing deterioration of the organic electroluminescent element. When the layer is too thin, luminescence efficiency increases, but the layer is subject to breakdown, thereby reducing the service life of the organic electroluminescent element.

Examples of well known hole injecting/transporting materials useable for the hole injecting/transporting layer include N,N'-diphenyl-N,N'-bis(3-methylphenyl)-1,1'-diphenyl-4,4'-diamine, N,N'-diphenyl-N,N'-bis(4-methylphenyl)-1,1'-diphenyl-4,4'-diamine, N,N'-diphenyl-N,N'-bis(1-naphthyl)-1,1'-diphenyl-4,4'-diamine, N,N'-diphenyl-N,N'-bis(2-naphthyl)-1,1'-diphenyl-4,4'-diamine, N,N'-tetra(4-methylphenyl)-1,1'-diphenyl 4,4'-diamine, N,N'-tetra(4-methylphenyl)-1,1'-bis(3-methylphenyl)-4,4'-diamine, N,N'-diphenyl-N,N'-bis(3-methylphenyl)-1,1'-bis(3-methylphenyl)-4,4'-diamine, N,N'-bis(N-carbazolyl)-1,1'-diphenyl-4,4'-diamine, 4,4'-4"-tris(N-carbazolyl)triphenylamine, N,N',N"-triphenyl-N,N',N"-tris(3-methylphenyl)-1,3,5-tri(4-aminophenyl)benzene, 4,4',4"-tris[N,N',N"-triphenyl-N,N',N"-tris(3-methylphenyl)]triphenylamine and the like. These materials may be used in mixtures of two or more types.

Then, an organic luminescent layer 3 is formed on the hole injecting/transporting layer 2.

Examples of well known organic luminescent materials useable for the organic luminescent layer include epidridine, 2,5-bis[5,7-di-t-pentyl-2-benzooxazolyl]thiophene, 2,2'-(1, 4-phenylenedivinylene)bisbenzothiazole, 2,2'-(4,4'-biphenylene)bisbenzothiazole, 5,-methyl-2-{2-[4-(5-methyl-2-benzooxazolyl)phenyl]vinyl}benzooxazole, 2,5-bis(5-methyl-2-benzooxazolyl)thiophene, anthracene, naphthalene, phenanthrene, pyrene, chrysene, perylene, perinone, 1,4-diphenylbutadiene, tetraphenylbutadiene, coumarin, acridine, stilbene, 2-(4-biphenyl)-6-phenylbenzooxazole, aluminum trisoxine, magnesium bisoxine, bis(benzo-8-quinolinol)zinc, bis(2-methyl-8-quinolinolate)aluminum oxide, indium trisoxine, aluminum tris(5-methyloxine), lithium oxine, gallium trisoxine, calcium bis(5-chlorooxine), polyzinc(8-hydroxy-5-quinolinolyl)methane, di-lithium epindridione, zinc bisoxine, 1,2-phthaloperinone, 1,2-naphthaloperinone and the like.

Examples of useable general luminescent materials include luminescent coumarin dye, luminescent perylene dye, luminescent pyran dye, luminescent thiopyran dye, luminescent polymethine, luminescent merocyanine, luminescent imidazole dye and the like. Among these materials, chelated oxynoid compounds are particularly desirable.

The organic luminescent layer may be a single layer structure of luminescent material, or it may have a multi-layer structure to adjust characteristics such as luminescence color, and luminescence intensity and the like. The luminescent layer may be doped with a mixture of two or more types of luminescent materials.

The organic luminescent layer may be formed by conventional methods such as vacuum deposition and application methods. When formed by vacuum deposition, the layer thickness is normally 1 to 200 nm, and when formed by application method, the layer thickness is normally 5 to 500 nm.

As the thickness of the layer increases, a greater voltage must be applied to induce luminescence, thereby adversely affecting luminescence efficiency, and causing deterioration of the organic electroluminescent element. When the layer is too thin, luminescence efficiency increases, but the layer is subject to breakdown, thereby reducing the service life of the organic electroluminescent element.

Next, an electron injection layer 4 comprising an alkali metal organic salt, an alkaline earth metal organic salt, an alkali metal organometallic complex or an alkaline earth metal organometallic complex is formed on the organic luminescent layer 3.

Specific examples of the alkali metal organic salt, alkaline earth metal organic salt, alkali metal organometallic complex or alkaline earth metal organometallic complex used in the electron injection layer include the compounds represented by the chemical structural formulae below.

Formula I (1)
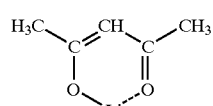

(2)
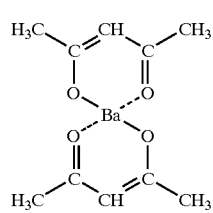

-continued (3)
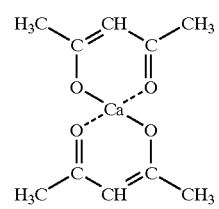

(4)
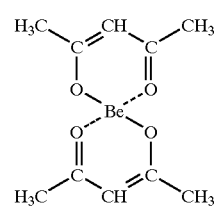

(5)
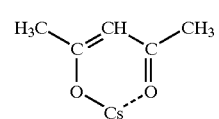

(6)
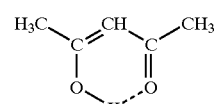

(7)
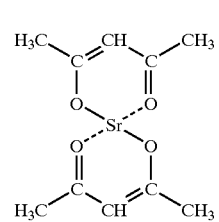

(8)
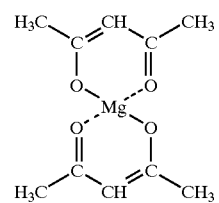

(9)
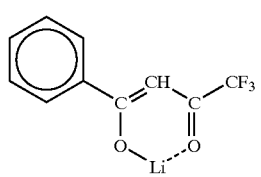

(10)
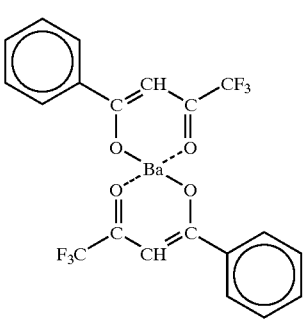

Formula 2

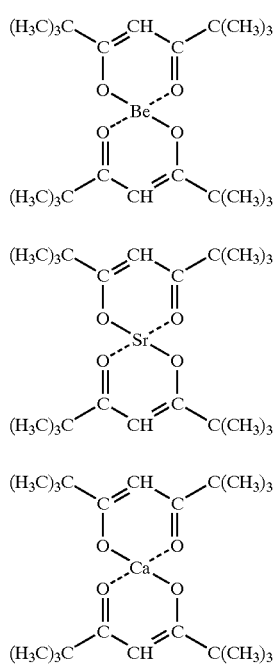 (26)
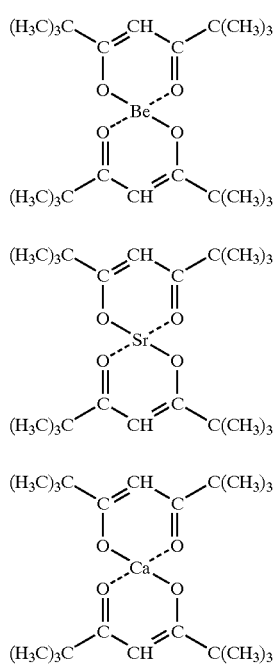 (27)
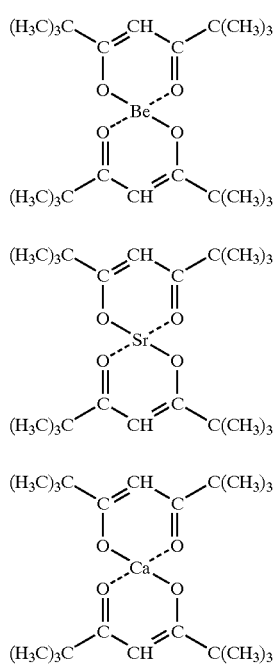 (28)
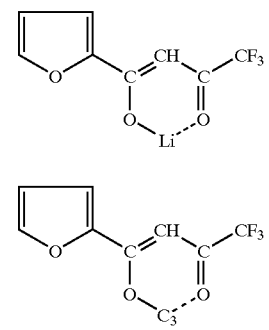 (29)
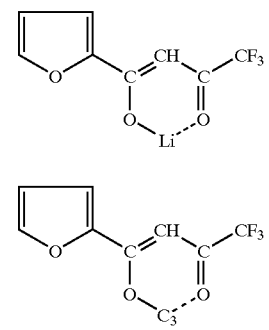 (30)
Formula 4
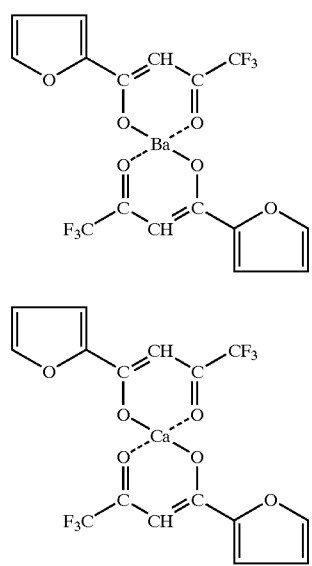 (31)
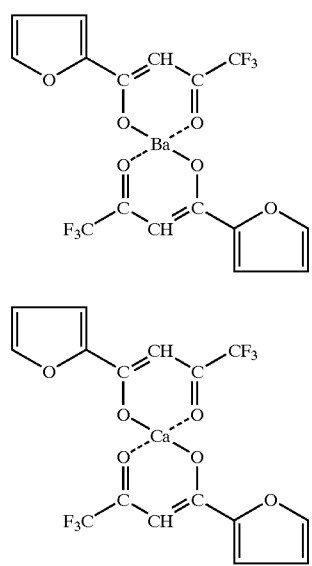 (32)
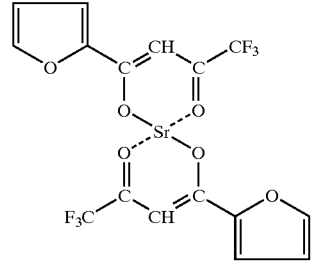 (33)
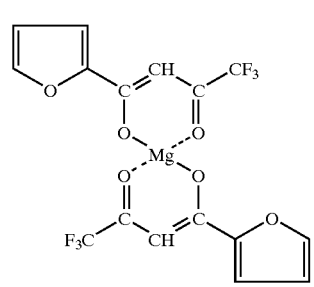 (34)
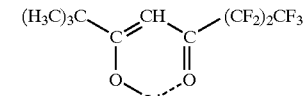 (35)
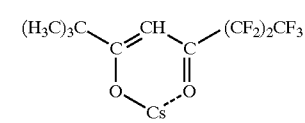 (36)
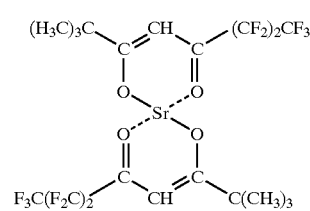 (37)
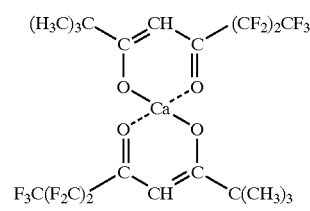 (38)
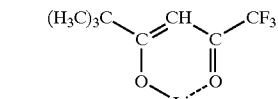 (39)
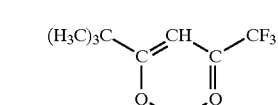 (40)

Formula 5
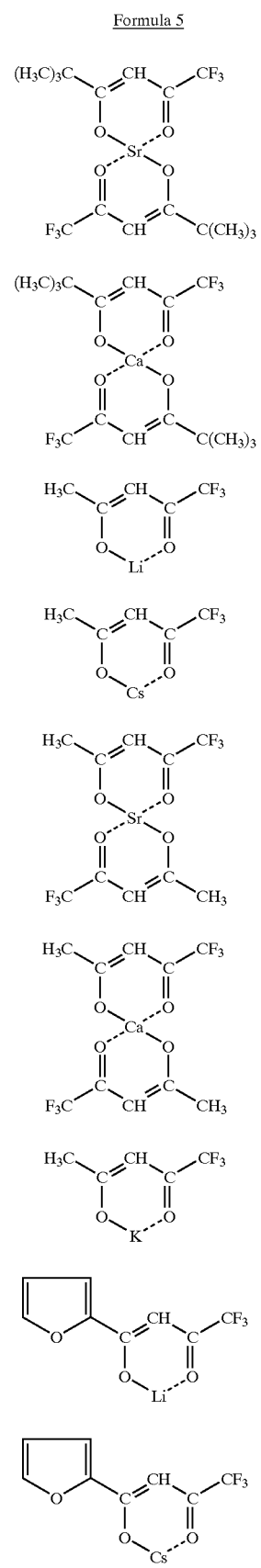
-continued
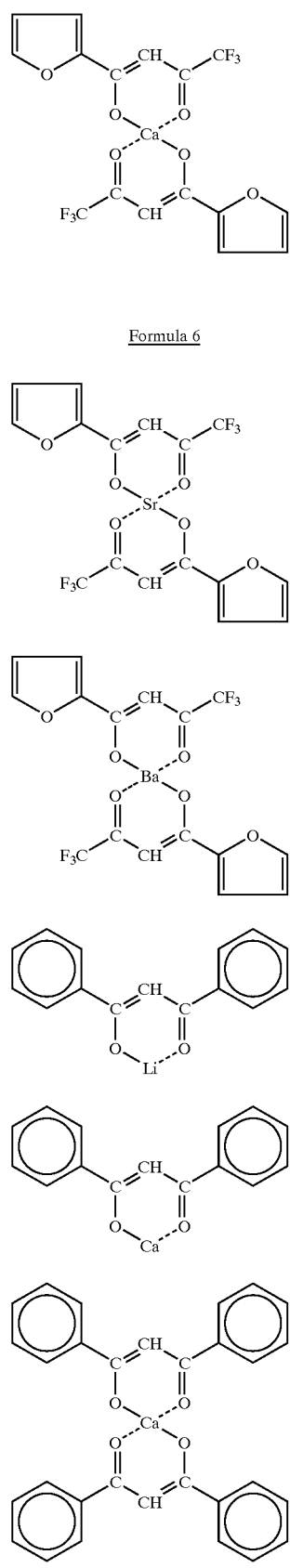
Formula 6

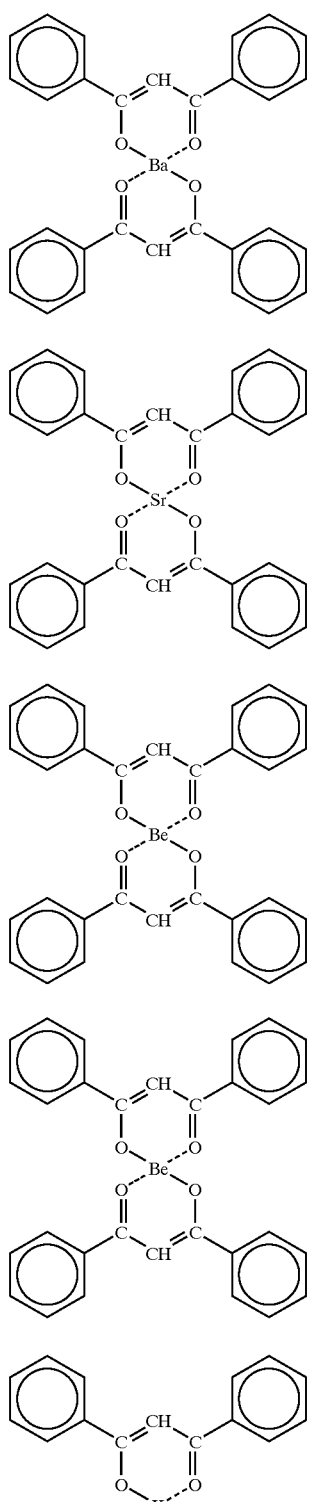
(56)
(57)
(58)
(59)
(60)
Formula 7
(61)
(62)
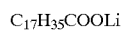 (63)
 (64)
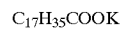 (65)
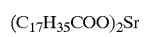 (66)
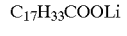 (67)
 (68)
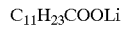 (69)
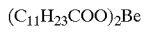 (70)
Formula 8
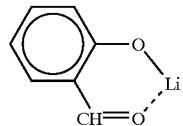 (71)
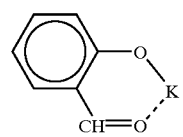 (72)
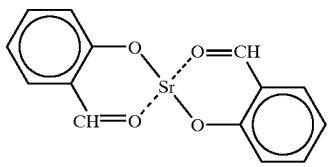 (73)
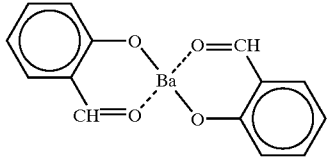 (74)
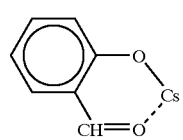 (75)
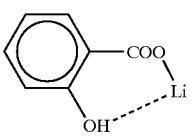 (76)
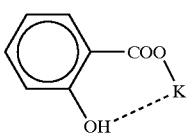 (77)

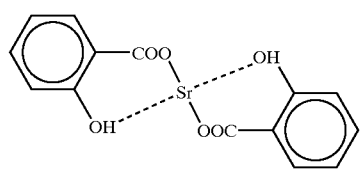
(78)
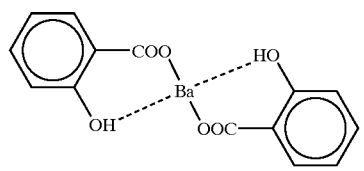
(79)
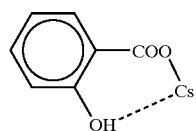
(80)
Formula 9
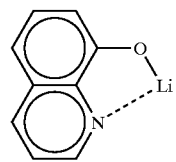
(81)
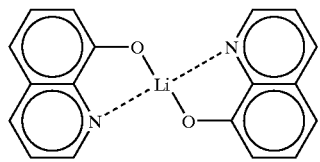
(82)
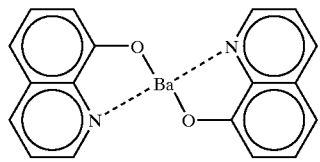
(83)
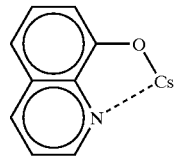
(84)
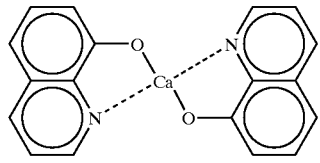
(85)
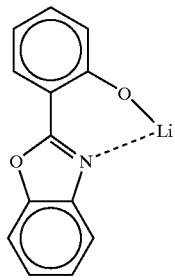
(86)
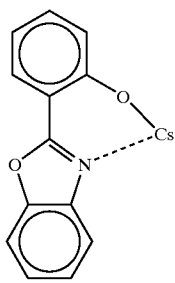
(87)
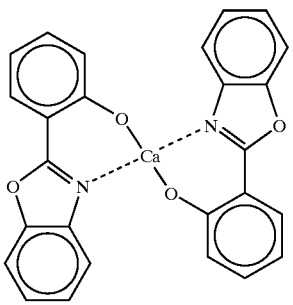
(88)
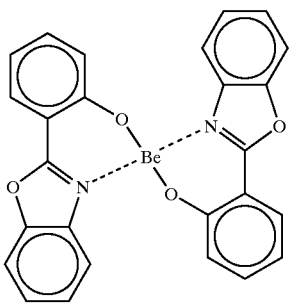
(89)
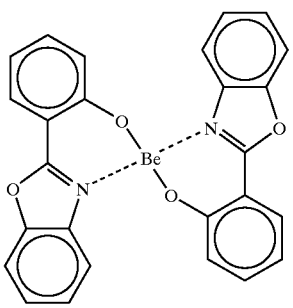
(90)

Formula 10

(91) 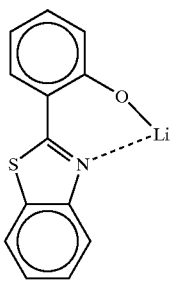

(92) 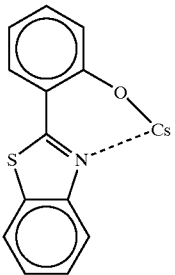

(93) 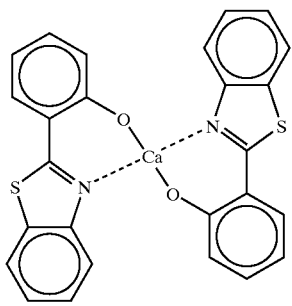

(94) 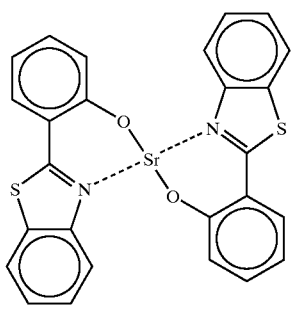

(95) 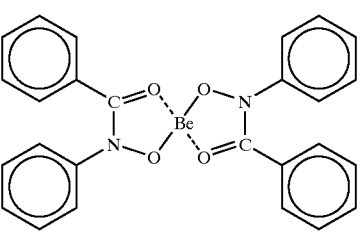

-continued

(96) 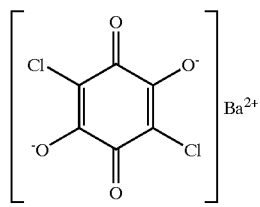

(97) 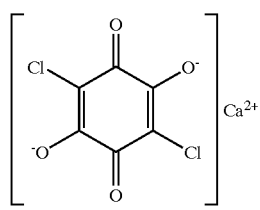

(98) 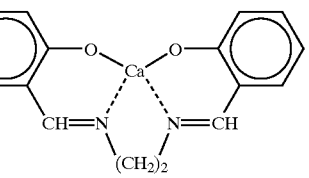

(99) Li(6,6-dibenzyl-14-crown-4)

(100) Ca(15-crown-5)

These compounds may be obtained as commercial products, or may be easily synthesized from commercial materials. The metal included in the organic salt or organometallic complex used for the electron injection layer may be other than described in these examples, insofar as such materials can be classified in the alkali metals and alkaline earth metals of the periodic table.

Among the aforesaid organic materials, acetyl acetonate complex is particularly desirable from the perspective of layer formability and luminescence characteristics.

Alkali and alkaline earth metals such as lithium, potassium, magnesium, strontium, calcium, cesium, barium and the like may be included in the organic salt or organometallic complex to improve electron injection characteristics. Among these metals, lithium, potassium, and cesium are particularly desirable from the perspective of luminescence characteristics. These compounds may be used in the layer in combinations of two or more types.

The electron injecting layer may be a mixed layer including two or more of an alkali metal organic salt, an alkaline earth metal organic salt, an alkali metal organometallic complex and/or an alkaline earth metal organometallic complex. The luminescence characteristics of the element are improved by using a mixed layer containing alkali metal or alkaline earth metal.

Metals useable for the aforesaid mixture include lithium, potassium, strontium, calcium, cesium, and barium for their excellent electron injection characteristics. Among these metals, lithium and calcium are most desirable.

The electron injecting layer may be formed by vacuum deposition to a thickness of 0.1 to 20 nm. As the thickness of the layer increases, a greater voltage must be applied to induce luminescence, thereby adversely affecting luminescence efficiency, and causing deterioration of the organic electroluminescent element. When the layer is too thin, luminescence efficiency increases, but it is difficult to form a uniform layer and defects result, so as to adversely affect luminescence efficiency and reduce the service life of the organic electroluminescent element.

The electron injecting layer using an alkali metal organic salt, an alkaline earth metal organic salt, an alkali metal organometallic complex or an alkaline earth metal organometallic complex may be formed by a typical resistance heating method, sputtering, LB vacuum deposition, ion plating, ionization vacuum deposition and other well known vacuum deposition methods.

Advantages of this embodiment of the invention include the extremely easy formation of the layer and excellent characteristics compared to when alkali metals or alkaline earth metals and metal oxide compounds thereof are used.

Finally, negative electrode 5 is formed on electron injecting layer 4 to produce the organic electroluminescent element.

The preceding description pertains to the production of an organic electroluminescent element of FIG. 1 having sequential layers of positive electrode 1, hole injecting/transporting layer 2, organic luminescent layer 3, electron injecting layer 4 and negative electrode 5, but FIGS. 2 and 3 show an organic electroluminescent element provided with electron transporting layer 6 interposed between organic luminescent layer 3 and electron injecting layer 4.

Examples of electron transporting materials useable for the electron transporting layer include nitro-substituted fluorenone derivatives, anthraquinodimethane derivatives, diphenoquinone derivatives, thiopyran dioxide derivatives, oxadiazole derivatives, triazole derivatives, thiadiazole derivatives, coumarin derivatives, chelated oxynoid compounds and the like. Among these materials, chelated oxynoid compounds are most desirable from the perspective of heat resistance.

The electron transporting layer may be formed by well known methods such as vacuum deposition and application methods. When formed by vacuum deposition, the layer thickness is approximately 5 to 200 nm, and when formed by an application method, the layer thickness is about 10 to 1,000 nm.

As shown in FIG. 4, protective overcoat layer 9 may be provided over the electrode. This overcoat layer 9 may be formed as a thin layer via vacuum deposition using silicon oxide, zinc oxide, magnesium fluoride, magnesium fluoride and like compounds. The thickness of this layer is desirably 5 to 1,000 nm.

The hole injecting function and the hole transporting function of the hole injecting/transporting layer may be separated so as to have a two layer construction of a hole transporting layer and a hole injecting layer, as shown in FIGS. 3 and 4.

The construction is not limited to the sequential layer formation on the positive electrode 1, and each layer may be sequentially formed ion the negative electrode 5.

The transparent electrodes comprising the negative electrode and the positive electrode are connected by a suitable lead 10 such as nickel wire, gold wire, copper wire, platinum wire and the like, and the organic electroluminescent element luminesces when a suitable violate Vs is applied to both electrodes.

The organic electroluminescent element of the aforesaid construction may be used in various types of display devices and the like.

EXAMPLES

Specific examples of the present invention are described below.

Example 1

On a glass substrate coated with indium-tin oxide was formed a layer of N,N'-diphenyl-N,N'-bis(3-methylphenyl)-1,1'-diphenyl-4,4'-diamine via vacuum deposition to form a hole injecting/transporting layer 60 nm in thickness.

On the hole injecting/transporting layer was formed an organic luminescent layer of aluminum trisoxine via vacuum deposition to a thickness of 60 nm.

On the organic luminescent layer was formed an electron injecting layer of compound (1) via resistance heating deposition in a vacuum to a thickness of 1 nm.

Then, on the electron injecting layer was formed a negative electrode of aluminum via vacuum deposition to a thickness of 200 nm.

In this way an organic electroluminescent element was produced.

Example 2

On a glass substrate coated with indium-tin oxide was formed a layer of N,N'-diphenyl-N,N'-bis(3-methylphenyl)-1,1'-diphenyl-4,4'-diamine via vacuum deposition to form a hole injecting/transporting layer 60 nm in thickness.

On the hole injecting/transporting layer was formed an organic luminescent layer of aluminum trisoxine via vacuum deposition to a thickness of 60 nm.

On the organic luminescent layer was formed an electron injecting layer of compound (5) via resistance heating in vacuum deposition to a thickness of 2 nm.

Then, on the electron injecting layer was formed a negative electrode of aluminum via vacuum deposition to a thickness of 200 nm.

In this way an organic electroluminescent element was produced.

Example 3

On a glass substrate coated with indium-tin oxide was formed a layer of N,N'-diphenyl-N,N'-bis(3-methylphenyl)-1,1'-diphenyl-4,4'-diamine via vacuum deposition to form a hole injecting/transporting layer 60 nm in thickness.

On the hole injecting/transporting layer was formed an organic luminescent layer of aluminum trisoxine via vacuum deposition to a thickness of 60 nm.

On the organic luminescent layer was formed an electron injecting layer of compound (6) via resistance heating in vacuum deposition to a thickness of 0.5 nm.

Then, on the electron injecting layer was formed a negative electrode of aluminum via vacuum deposition to a thickness of 200 nm.

In this way an organic electroluminescent element was produced.

Example 4

On a glass substrate coated with indium-tin oxide was formed a layer of N,N'-diphenyl-N,N'-bis(3-methylphenyl)-1,1'-diphenyl-4,4'-diamine via vacuum deposition to form a hole injecting/transporting layer 60 nm in thickness.

On the hole injecting/transporting layer was formed an organic luminescent layer of aluminum trisoxine via vacuum deposition to a thickness of 60 nm.

On the organic luminescent layer was formed an electron injecting layer of compound (9) via resistance heating in vacuum deposition to a thickness of 1.5 nm.

Then, on the electron injecting layer was formed a negative electrode of aluminum via vacuum deposition to a thickness of 200 nm.

In this way an organic electroluminescent element was produced.

Reference Example 1

An organic electroluminescent element was produced identical to the element of Example 1 with the exception that the electron injection layer was omitted.

Reference Example 2

An organic electroluminescent element was produced identical to the element of Example 1 with the exception that the electron transporting layer was formed together with the luminescent layer using compound (3) via vacuum deposition to a thickness of 60 nm.

Example 5

On a glass substrate coated with indium-tin oxide was formed a layer of N,N'-diphenyl-N,N'-bis(1-naphthyl)-1,1'-diphenyl-4,4'-diamine via vacuum deposition to form a hole injecting/transporting layer 55 nm in thickness.

On the hole injecting/transporting layer was formed an organic luminescent layer via co-vacuum deposition of aluminum trisoxine doped with 5 wt % rubrene to a thickness of 10 nm.

On the organic luminescent layer was formed an electron transporting layer of aluminum trisoxine via vacuum deposition to a thickness of 45 mn.

On the organic luminescent layer was formed an electron injecting layer of compound (17) via resistance heating in vacuum deposition to a thickness of 2 nm.

Then, on the electron injecting layer was formed a negative electrode of aluminum via vacuum deposition to a thickness of 200 nm.

In this way an organic electroluminescent element was produced.

Reference Example 3

An organic electroluminescent element was produced identical to the element of Example 5 with the exception that the electron injecting layer was omitted.

Example 6

On a glass substrate coated with indium-tin oxide was formed a layer of copper phthalocyanine via vacuum deposition to form a hole injecting layer 15 nm in thickness.

On the hole injecting layer was formed a hole transporting layer of N,N'-diphenyl-N,N'-bis(1-naphthyl)-1,1'-diphenyl-4,4'-diamine via vacuum deposition to a thickness of 55 nm.

On the hole transporting layer was formed an organic luminescent layer via co-vacuum deposition of aluminum trisoxine doped with 5 wt % rubrene to a thickness of 10 nm.

On the organic luminescent layer was formed an electron transporting layer of aluminum trisoxine via vacuum deposition to a thickness of 45 nm.

On the electron transporting layer was formed an electron injecting layer of compound (30) via resistance heating in vacuum deposition to a thickness of 5 nm.

Finally, on the electron injecting layer was formed a negative electrode of indium via vacuum deposition to a thickness of 200 nm.

In this way an organic electroluminescent element was produced.

Example 7

On a glass substrate coated with indium-tin oxide was formed a layer of 4,4',4"-tris[N,N',N"-triphenyl-N,N',N"-tris(3-methylphenyl)]triphenylamine via vacuum deposition to form a hole injecting layer 15 nm in thickness.

On the hole injecting layer was formed an organic luminescent layer via co-vacuum deposition of N,N'-diphenyl-N,N'-bis(4-methylphenyl)-1,1'-bis(3-methylphenyl)-4,4'-diamine doped with 5 wt % rubrene to a thickness of 45 nm.

On the organic luminescent layer was formed an electron transporting layer of aluminum trisoxine via vacuum deposition to a thickness of 60 nm.

On the electron transporting layer was formed an electron injecting layer of compound (35) via resistance heating in vacuum deposition to a thickness of 2 nm.

Finally, on the electron injecting layer was formed a negative electrode of indium via vacuum deposition to a thickness of 200 nm.

In this way an organic electroluminescent element was produced.

Example 8

On a glass substrate coated with indium-tin oxide was formed a layer of N,N'-diphenyl-N,N'-bis(1-naphthyl)-1,1'-diphenyl-4,4'-diamine via vacuum deposition to form a hole injecting/transporting layer 55 nm in thickness.

On the hole injecting/transporting layer was formed an organic luminescent layer via co-vacuum deposition of N,N'-diphenyl-N,N'-bis(4-methylphenyl)-1,1'-bis(3-methylphenyl)-4,4'-diamine doped with 5 wt % rubrene to a thickness of 10 nm.

On the organic luminescent layer was formed an electron transporting layer of aluminum trisoxine via vacuum deposition to a thickness of 45 nm.

On the electron transporting layer was formed an electron injecting layer of compound (40) via resistance heating in vacuum deposition to a thickness of 2 nm.

Finally, on the electron injecting layer was formed a negative electrode of aluminum via vacuum deposition to a thickness of 200 nm.

In this way an organic electroluminescent element was produced.

Example 9

On a glass substrate coated with indium-tin oxide was formed a layer of copper phthalocyanine pigment via vacuum deposition to form a hole injecting layer 15 nm in thickness.

On the hole injecting layer was formed a hole transporting layer of N,N'-diphenyl-N,N'-bis(1-naphthyl)-1,1'-diphenyl-4,4'-diamine via vacuum deposition to a thickness of 45 nm.

On the hole transporting layer was formed an organic luminescent layer via co-vacuum deposition of aluminum trisoxine doped with 5 wt % rubrene to a thickness of 20 nm.

On the organic luminescent layer was formed an electron transporting layer of aluminum trisoxine via vacuum deposition to a thickness of 35 nm.

On the electron transporting layer was formed an electron injecting layer of compound (47) via resistance heating in vacuum deposition to a thickness of 5 nm.

Finally, on the electron injecting layer was formed a negative electrode of indium via vacuum deposition to a thickness of 200 nm.

In this way an organic electroluminescent element was produced.

Example 10

On a glass substrate coated with indium-tin oxide was formed a layer of copper phthalocyanine via vacuum deposition to form a hole injecting layer 15 nm in thickness.

On the hole injecting layer was formed a hole transporting layer of N,N'-diphenyl-N,N'-bis(1-naphthyl)-1,1'-diphenyl-4,4'-diamine via vacuum deposition to a thickness of 45 nm.

On the hole transporting layer was formed an organic luminescent layer via co-vacuum deposition of aluminum trisoxine doped with 5 wt % rubrene to a thickness of 20 nm.

On the organic luminescent layer was formed an electron transporting layer of aluminum trisoxine via vacuum deposition to a thickness of 40 nm.

On the electron transporting layer was formed an electron injecting layer of compound (55) via resistance heating in vacuum deposition to a thickness of 1 nm.

Finally, on the electron injecting layer was formed a negative electrode of aluminum via vacuum deposition to a thickness of 200 mn.

In this way an organic electroluminescent element was produced.

Example 11

On a glass substrate coated with indium-tin oxide was formed a layer of polyaniline via spin coating to form a hole injecting layer 15 nm in thickness.

On the hole injecting layer was formed a hole transporting layer of N,N'-diphenyl-N,N'-bis(1-naphthyl)-1,1'-diphenyl-4,4'-diamine via vacuum deposition to a thickness of 45 nm.

On the hole transporting layer was formed an organic luminescent layer via co-vacuum deposition of aluminum trisoxine doped with 5 wt % rubrene to a thickness of 20 nm.

On the organic luminescent layer was formed an electron transporting layer of aluminum trisoxine via vacuum deposition to a thickness of 40 nm.

On the electron transporting layer was formed an electron injecting layer of compound (63) via resistance heating in vacuum deposition to a thickness of 2 nm.

Finally, on the electron injecting layer was formed a negative electrode of silver via vacuum deposition to a thickness of 200 nm.

In this way an organic electroluminescent element was produced.

Example 12

On a glass substrate coated with indium-tin oxide was formed a layer of copper phthalocyanine pigment via vacuum deposition to form a hole injecting layer 15 nm in thickness.

On the hole injecting layer was formed a hole transporting layer of N,N'-diphenyl-N,N'-bis(1-naphthyl)-1,1'-diphenyl-4,4'-diamine via vacuum deposition to a thickness of 45 nm.

On the hole transporting layer was formed an organic luminescent layer via co-vacuum deposition of aluminum trisoxine doped with 5 wt % rubrene to a thickness of 20 nm.

On the organic luminescent layer was formed an electron transporting layer of aluminum trisoxine via vacuum deposition to a thickness of 40 nm.

On the electron transporting layer was formed an electron injecting layer of compound (75) and metallic lithium via resistance heating in co-vacuum deposition to form a mixed layer of 2 wt % metallic lithium having a thickness of 2 nm.

Finally, on the electron injecting layer was formed a negative electrode of aluminum via vacuum deposition to a thickness of 200 nm.

In this way an organic electroluminescent element was produced.

Example 13

On a glass substrate coated with indium-tin oxide was formed a hole injecting/transporting layer of N,N'-diphenyl-N,N'-bis(3-methylphenyl)-1,1'-diphenyl-4,4'-diamine via vacuum deposition to a thickness of 60 nm.

On the hole injecting/transporting layer was formed an organic luminescent layer via co-vacuum deposition of aluminum trisoxine doped with 5 wt % rubrene to a thickness of 20 nm.

On the organic luminescent layer was formed an electron transporting layer of aluminum trisoxine via vacuum deposition to a thickness of 35 nm.

On the electron transporting layer was formed an electron injecting layer of compound (20) and metallic calcium via resistance heating in co-vacuum deposition to form a mixed layer of 5 wt % metallic calcium having a thickness of 3 nm.

Finally, on the electron injecting layer was formed a negative electrode of aluminum via vacuum deposition to a thickness of 200 nm.

In this way an organic electroluminescent element was produced.

EVALUATIONS

The organic electroluminescent elements of examples 1 through 13 and reference examples 1 through 3 were evaluated using the glass electrode as the positive electrode, and a gradually applying a DC voltage to a voltage V to start luminescence, then measuring the luminance of luminescence ($cd/m^2$) when a 5 V DC voltage was applied, and when a 10 V DC voltage was applied.

The maintenance rate (%) after 5 hr of operation from the initial output at a current density of 5 $mA/cm^2$ (i.e., [output after 5 hr ($mW/cm^2$)/initial output ($mW/cm^2$)×100]) was determined.

The measurement results are shown in Table 1.

TABLE 1

|  | start luminescence voltage (V) | luminance of luminescence: 5 V ($cd/m^2$) | Luminance of luminescence: 10 V ($cd/m^2$) | maintenance rate of initial output (%) |
| --- | --- | --- | --- | --- |
| Example 1 | 3.5 | 63 | 8520 | 95 |
| Example 2 | 3.0 | 51 | 5240 | 93 |
| Example 3 | 3.0 | 62 | 7440 | 93 |
| Example 4 | 3.0 | 82 | 10630 | 94 |
| Reference | 7.0 | 12 | 320 | 54 |

TABLE 1-continued

|  | start luminescence voltage (V) | luminance of luminescence: 5 V (cd/m$^2$) | Luminance of luminescence: 10 V (cd/m$^2$) | maintenance rate of initial output (%) |
|---|---|---|---|---|
| Example 1 Reference Example 2 | 9.0 | 0 | 20 | 43 |
| Example 5 | 3.0 | 70 | 10160 | 91 |
| Reference Example 3 | 8.5 | 0 | 45 | 51 |
| Example 6 | 2.5 | 90 | 15940 | 93 |
| Example 7 | 3.0 | 70 | 11270 | 90 |
| Example 8 | 3.0 | 55 | 8100 | 91 |
| Example 9 | 2.5 | 80 | 13350 | 93 |
| Example 10 | 3.0 | 45 | 6400 | 89 |
| Example 11 | 2.5 | 75 | 12590 | 93 |
| Example 12 | 2.5 | 95 | 17500 | 92 |
| Example 13 | 2.5 | 100 | 19150 | 93 |

As can be seen from Table 1, the organic electroluminescent element of the examples started luminescing at low potential, and produced excellent luminance. The organic electroluminescent element of the examples exhibited scant output reduction, and produced stable luminescence over a long service life.

The organic electroluminescent element of the present invention provides improved luminance efficiency and luminance, and increased service life, and is not limited as to luminance materials, luminance enhancing materials, charge transporting materials, sensitizers, resins, electrode materials, or element manufacturing method.

As described above, the organic electroluminescent element of the present invention provides increased luminance intensity, low luminance starting voltage, and excellent durability by including alkali metal, or organic salt or organometallic complex of alkaline earth metal in the electron injecting layer of the organic electroluminescent element.

What is claimed is:

1. An organic electroluminescent element comprising a positive electrode, a luminescent layer, an electron injection layer, and a negative electrode, wherein the electron injection layer is formed of an acetylacetonate complex of an alkali metal or an alkaline earth metal or a derivative of an acetylacetonate complex of an alkali metal or an alkaline earth metal.

2. The organic electroluminescent element of claim 1, wherein the electron injection layer has a thickness of 0.1 to 20 nm.

3. The organic electroluminescent element of claim 1, wherein the alkali or alkaline earth metal is lithium, potassium, calcium or cesium.

4. The organic electroluminescent element of claim 1, wherein the electron injection layer is formed of a mixture of acetylacetonate complexes of an alkali metal or an alkaline earth metal or of derivatives of acetylacetonate complexes of an alkali metal or an alkaline earth metal.

5. The organic electroluminescent element of claim 4, wherein the mixture includes an alkoxide.

6. An organic electroluminescent element comprising:

a positive electrode;

a luminescent layer;

an electron injection layer having a thickness in a range from 0.1 nm to 3 nm and being formed of an alkali metal organic salt, an alkaline earth metal organic salt, an alkali metal organometallic complex or an alkaline earth metal organometallic complex; and a negative electrode.

7. An organic electroluminescent element comprising:

a positive electrode;

a luminescent layer;

an electron transporting layer formed of a first material;

an electron injection layer formed of a second material different from the first material, said second material being formed of an alkali metal organic salt, an alkaline earth metal organic salt, an alkali metal organometallic complex or an alkaline earth metal organometallic complex; and a negative electrode, wherein the luminescent layer, the electron transporting layer and the electron injection layer are each provided separately.

8. An organic electroluminescent element of claim 7, wherein the electron transporting layer has a thickness in a range from 5 nm to 200 nm.

9. An organic electroluminescent element of claim 7, wherein the electron transporting layer has a thickness in a range from 10 nm to 1000 nm.

10. An organic electroluminescent element of claim 7, wherein the electron injection layer has a thickness in a range from 0.1 nm to 20 nm.

11. An organic electroluminescent element of claim 7, wherein the first material does not include the alkali metal organic salt, the alkaline earth metal organic salt, the alkali metal organometallic complex or the alkaline earth metal organometallic complex that is contained in the second material.

* * * * *